United States Patent
Seol et al.

(10) Patent No.: US 9,053,774 B2
(45) Date of Patent: Jun. 9, 2015

(54) DUTY CYCLE CORRECTOR AND SYSTEMS INCLUDING THE SAME

(71) Applicant: SAMSUNG ELECTRONICS CO., LTD., Suwon-si, Gyeonggi-do (KR)

(72) Inventors: Ho-Seok Seol, Daegu (KR); Seung-Jun Bae, Hwaseong-si (KR); Ho-Sung Song, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 37 days.

(21) Appl. No.: 14/066,193

(22) Filed: Oct. 29, 2013

(65) Prior Publication Data

US 2014/0119140 A1 May 1, 2014

(30) Foreign Application Priority Data

Oct. 30, 2012 (KR) .................. 10-2012-0120979

(51) Int. Cl.
G11C 7/00 (2006.01)
G11C 8/18 (2006.01)
H03K 5/156 (2006.01)
G11C 29/02 (2006.01)

(52) U.S. Cl.
CPC ............... *G11C 8/18* (2013.01); *H03K 5/1565* (2013.01); *G11C 29/023* (2013.01); *G11C 29/028* (2013.01)

(58) Field of Classification Search
USPC ............ 365/191, 189.011, 193, 225.7, 233.1, 365/233.11, 233.12, 233.14, 239, 241; 327/175
See application file for complete search history.

(56) References Cited

U.S. PATENT DOCUMENTS

| | | | |
|---|---|---|---|
| 6,415,390 B1 | 7/2002 | Manning | |
| 7,994,834 B2 | 8/2011 | Ku | |
| 2007/0047375 A1* | 3/2007 | Minzoni | ....................... 365/233 |
| 2007/0183180 A1 | 8/2007 | Lee | |
| 2009/0231006 A1* | 9/2009 | Jang et al. | ..................... 327/175 |
| 2010/0054055 A1* | 3/2010 | Choi et al. | .................... 365/193 |
| 2011/0007595 A1 | 1/2011 | Agata et al. | |
| 2011/0175657 A1 | 7/2011 | Chong et al. | |
| 2011/0204948 A1 | 8/2011 | Satoh et al. | |
| 2011/0221496 A1 | 9/2011 | Kim | |

FOREIGN PATENT DOCUMENTS

| | | |
|---|---|---|
| KR | 10-2001-00071575 A | 7/2001 |
| KR | 10-2011-0030530 A | 3/2011 |

* cited by examiner

*Primary Examiner* — Fernando Hidalgo
(74) *Attorney, Agent, or Firm* — Lee & Morse, P.C.

(57) ABSTRACT

A duty cycle corrector includes a sensing unit, a pad unit, a fuse unit, and a driver unit. The sensing unit generates at least one sensing signal based on the sensed duty cycle ratio of an output signal. The pad unit outputs at least one decision signal based on the at least one sensing signal. The fuse unit generates a duty cycle control signal based on at least one received fuse control signal. The driver unit adjusts a duty cycle ratio of an input signal to generate the output signal based on the duty cycle control signal. The driver unit adjusts the duty cycle ratio of the input signal by adjusting a pull-up strength or a pull-down strength of the input signal based on the duty cycle control signal.

20 Claims, 14 Drawing Sheets

DUTY CYCLE CORRECTOR AND SYSTEMS INCLUDING THE SAME

CROSS-REFERENCE TO RELATED APPLICATION

Korean Patent Application No. 10-2012-0120979, filed on Oct. 30, 2012, and entitled: "Duty Correction Units and Systems Including the Same," is incorporated by reference herein in its entirety.

BACKGROUND

1. Field

Embodiments herein relate to processing signals in an electronic system.

2. Description of the Related Art

In semiconductor memory devices such as DRAMs, the duty cycle of a clock signal is a factor that affects performance. According to one approach, a duty cycle correction unit is employed in a tree structure (e.g., a clock tree) for correcting the duty cycle of the clock signal. However, such a duty cycle correction unit may be unsuitable for various applications, not the least of which include use in a data path or an address path where random data pattern is input.

SUMMARY

In accordance with one embodiment, a duty cycle corrector includes a sensing unit configured to sense a duty cycle ratio of an output signal toggling periodically to generate at least one sensing signal based on the sensed duty cycle ratio; a pad unit configured to output at least one decision signal based on the at least one sensing signal; a fuse unit that includes a plurality of fuse elements which are selectively programmed in response to a fuse control signal, the fuse unit configured to generate the duty control signal based on the fuse control signal to generate the duty cycle control signal; and a driver unit that buffers an input signal toggling periodically in a test mode and adjusts a duty cycle ratio of the input signal, the driver unit configured to adjust a pull-up strength or a pull-down strength of the input signal to generate the output signal in response to the duty control signal.

Also, the sensing unit may include a filter configured to average the output signal to provide an analog signal that is proportional to the duty cycle ratio of the output signal; a reference voltage generation unit configured to generate at least one reference voltage according to a target duty cycle ratio; and a comparison unit configured to compare the analog signal and the at least one reference voltage to provide the sensing signal.

Also, the filter may include a first resistor that has a first terminal to which the output signal is applied; and a capacitor connected between a second terminal of the first resistor and a ground voltage.

Also, the reference voltage generation unit may include a plurality of resistors connected in series between a power supply voltage and the ground voltage, and the reference voltage generation unit may provide the at least one reference voltage to the comparison unit based on voltage division using the plurality of resistors.

Also, the comparison unit may include a first comparator configured to compare the analog signal and a first reference voltage of the at least one reference voltage; a second comparator configured to compare the analog signal and a second reference voltage of the at least one reference voltage; a first AND gate that performs AND operation on a first inverted output and an output of the second comparator to provide a first sensing signal, the first inverted output corresponding to an inverted output of the first comparator; and a second AND gate that performs AND operation on a second inverted output and the first inverted output to provide a second sensing signal, the second inverted output corresponding to an inverted output of the second comparator.

Also, the comparison unit may include a first comparator configured to compare the analog signal and a first reference voltage of the at least one reference voltage; a second comparator configured to compare the analog signal and a second reference voltage of the at least one reference voltage; a third comparator configured to compare the analog signal and a third reference voltage of the at least one reference voltage; and a fourth comparator configured to compare the analog signal and a fourth reference voltage of the at least one reference voltage;

The comparison unit may also include a first AND gate that performs AND operation on outputs of the first through fourth AND gates to provide a first sensing output signal; a second AND gate that performs AND operation on outputs of the second through fourth AND gates and a first inverted output signal to provide a second sensing signal, the first inverted output corresponding to an inverted output of the first comparator; a third AND gate that performs AND operation on outputs of the third and fourth AND gates, the first inverted output signal and a second inverted output signal to provide a third sensing signal, the second inverted output corresponding to an inverted output of the second comparator; a fourth AND gate that performs AND operation on output of the fourth AND gates, the first and second inverted output signals and a third inverted output signal to provide a fourth output signal, the third inverted output corresponding to an inverted output of the third comparator; and a fifth AND gate that performs AND operation on the first through third inverted output signals and a fourth inverted output signal to provide a fifth sensing signal, the fourth inverted output corresponding to an inverted output of the fourth comparator.

Also, the pad unit may include a logic unit configured to determine a logic level of the at least one decision signal based on the at least one sensing signal; and at least one monitoring pad that outputs the at least one decision signal, wherein the at least one decision signal includes a pass signal and at least one up signal, the pass signal indicating whether the duty cycle ratio of the output signal is within a range of the target duty cycle ratio, the up signal adjusting the pull-up strength and pull-down strength of the input signal to generate the output signal.

Also, the fuse unit may include a plurality of fuse cells that are selectively programmed in response to the fuse control signals; a plurality of program transistors that select at least one of the fuse cells to be programmed in response to a program signal; and a plurality of sensing units, each connected to each of the fuse cells, the sensing units providing the duty cycle control signals, wherein each of the fuse cells includes: a fuse element connected to a voltage pad; and an access transistor connected to the fuse element, wherein the access transistor has a first terminal connected to the voltage pad and a second terminal connected to the access transistor, and one of the program voltage and a ground voltage is applied to the voltage bad according to whether the fuse element is programmed or not. Each of the fuse elements may include anti-fuse or electrical fuse.

Also, the driver unit may include a first buffer that buffers the input signal; a second buffer connected in series with the first buffer at a connection node, the second buffer buffering an output of the first buffer to provide the output signal; a pull-up control unit that increases the pull-up strength of the input signal in response to a first duty cycle control signal; and a pull-down control unit that increases the pull-down strength of the input signal in response to a second duty cycle control signal.

Also, the first duty cycle control signal may have a logic low level when a first fuse element of the fuse elements is programmed, and the second duty cycle control signal may have a logic high level when a second fuse element of the fuse elements is programmed.

In accordance with another embodiment, a system includes a semiconductor memory device including a sensing unit, a driver unit, and a fuse unit; and an automatic test equipment (ATE) configured to generate a plurality of fuse control signals for the fuse unit based on at least one sensing signal from the sensing unit, a plurality of fuse elements in the fuse unit being selectively programmed in response to the fuse control signals.

The sensing unit may be configured to sense a duty cycle ratio of an output signal toggling periodically to generate the at least one sensing signal according to the sensed duty cycle ratio. The fuse unit may be configured to generate a plurality of duty cycle control signals based on the fuse control signals. The driver unit may be configured to buffer an input signal toggling periodically in a test mode and to adjust a duty cycle of the input signal to provide the output signal, the driver unit adjusting a pull-up strength or a pull-down strength of the input signal in response to one of the duty control signals to set the duty ratio of the output signal.

Also, the sensing unit and the driver unit may be included in at least one of a data path, a clock path, and an address path of the semiconductor memory device.

Also, the semiconductor memory device may include a pad unit that provides the sensing signal to the ATE as at least one decision signal, and the at least one decision signal includes a pass signal and at least one up signal, the pass signal indicating whether the duty cycle ratio of the output signal is within a range of a target duty cycle ratio, the up signal adjusting the pull-up strength or the pull-down strength of the output signal.

Also, the ATE may generate the fuse control signals such that fuse elements in the fuse unit are not programmed when the pass signal indicates that the duty cycle ratio of the output signal is within a range of the target duty ratio, and the ATE generates the fuse control signals such that the pull-up strength or the pull-down strength of the input signal is increased when the pass signal indicates that the duty cycle ratio of the output signal is out of the range of the target duty ratio.

Also, the fuse control signal is received in response to the at least one decision signal, and the fuse unit may be configured to generate different duty cycle control signals based on different received fuse control signals.

In accordance with another embodiment, a duty cycle corrector includes a sensor to sense a duty cycle ratio of an output signal and generate at least one sensing signal based on the sensed duty cycle ratio; a pad to output at least one decision signal based on the at least one sensing signal; a fuse unit to generate a duty cycle control signal based on at least one received fuse control signal, the fuse unit including a plurality of selectively programmable fuse elements to be configured based on the fuse control signal in order to generate the duty cycle control signal; and a driver to adjust a duty cycle ratio of an input signal to generate the output signal, wherein the driver adjusts the duty cycle ratio of the input signal based on the duty cycle control signal, the driver adjusting the duty cycle ratio of the input signal by adjusting a pull-up strength or a pull-down strength of the input signal based on the duty cycle control signal.

Also, the fuse control signal may be received in response to the at least one decision signal, and the fuse unit may generate different duty cycle control signals based on different received fuse control signals.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Figure 1:
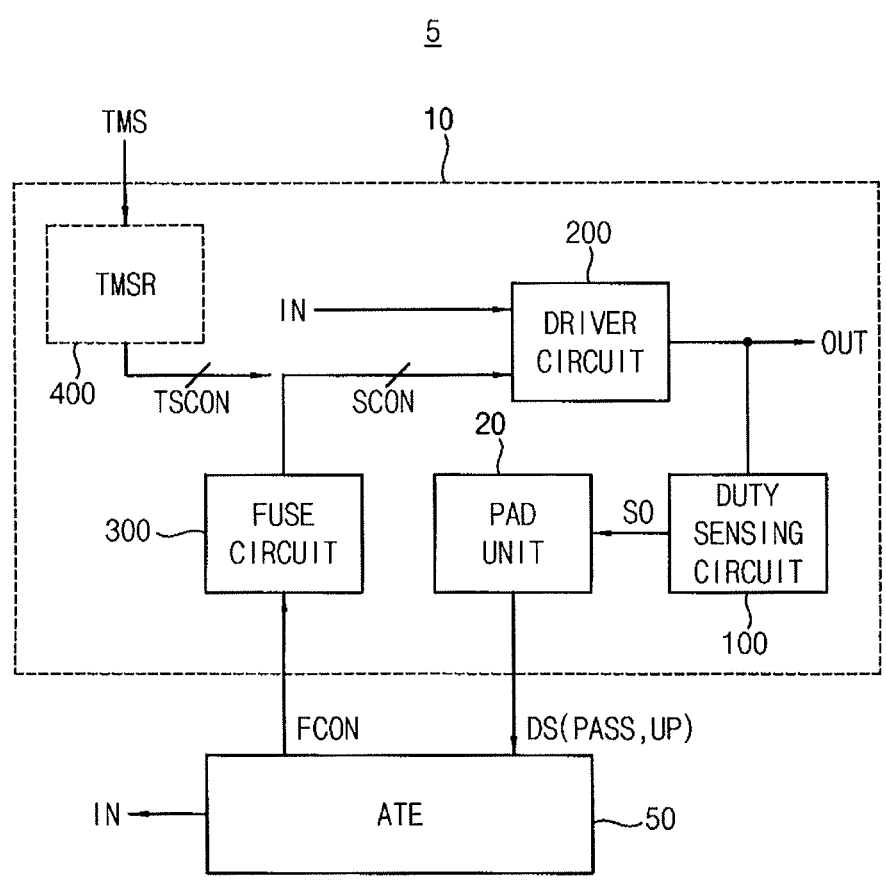
FIG. 1 illustrates an embodiment of a duty cycle correction circuit.

FIG. 1 illustrates a system 5 which includes an embodiment of a duty cycle corrector 10 coupled to automatic test equipment (ATE) 50. The duty cycle corrector 10 may include a duty cycle sensing unit 100 (or sensing unit), a pad unit 20, a fuse unit 300, and a driver unit 200. The duty cycle corrector 10 may further include a test mode set register (TMSR) 400 that provides duty cycle control signals TSCON to the driver unit 200 in a test mode.

The driver unit 200 buffers an input signal IN toggling periodically in a test mode to provide an output signal OUT in the test mode. More specifically, the driver unit adjusts the duty cycle of the input signal to set the duty cycle of the output signal. The input signal IN may be provided from the ATE 50 in the test mode. The duty cycle sensing unit 100 senses a duty cycle ratio of the output signal OUT, which toggles periodically, to generate at least one sensing output signal SO based on the sensed duty cycle ratio in the test mode.

The pad unit 20 receives the sensing output signal SO and provides at least one decision signal DS to the external ATE 20 based on the sensing output signal SO. The decision signal DS may include a pass signal PASS indicating whether duty cycle ratio of the output signal OUT is within a range of the target duty cycle ratio and an up signal for adjusting duty cycle ratio of the output signal OUT.

The ATE 50 receives the pass signal PASS and the up signal UP to generate fuse control signals FCON for selectively programming fuse elements in the fuse unit 300 based on logic levels of the pass signal PASS and the up signal UP. The fuse unit 300 receives the fuse control signals FCON and programs selectively the fuse elements based on the fuse control signals FCON to generate duty cycle control signals SCON.

The driver unit 200 adjusts pull-up strength and pull-down strength of the output signal OUT, toggling periodically, to correct duty cycle ratio of the output signal OUT, in response to the duty cycle control signals SCON.

Figure 2:
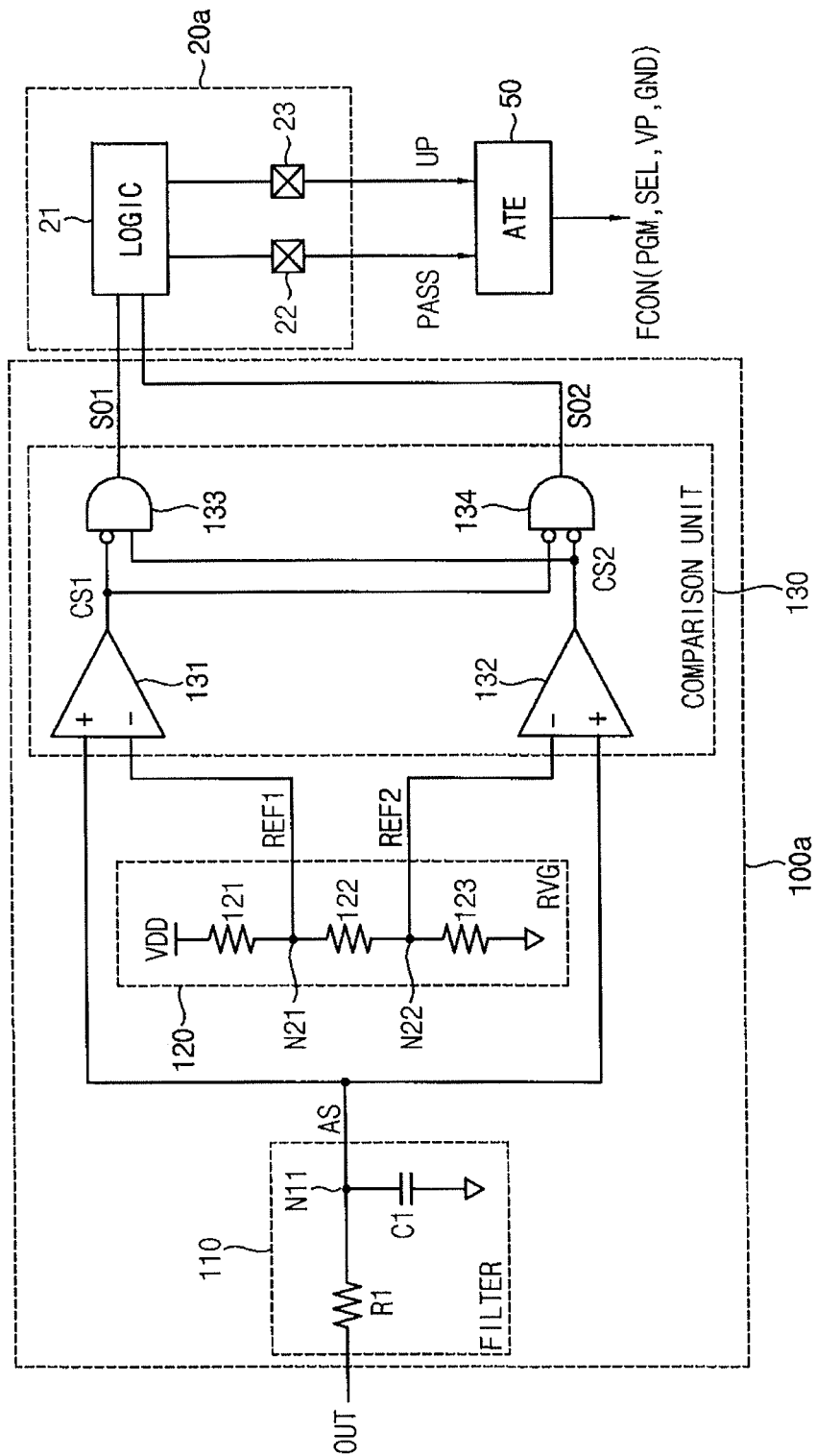
FIG. 2 illustrates a duty cycle sensing unit and pad unit in FIG. 1.

FIG. 2 illustrates an embodiment the duty cycle sensing unit and the pad unit. Referring to FIG. 2, a duty cycle sensing unit 100a may include a filter 110, a reference voltage generation unit (RVG) 120, and a comparison unit 130. The pad unit 20a may include a logic unit 21 and monitoring pads 22 and 23. The term "unit" as used herein may be understood to correspond to a circuit or other hardware, code-based instructions performed by a processor, or a combination thereof.

The filter 110 includes a first resistor R1 and a capacitor C1. The resistor R1 has a first terminal receiving the output signal OUT and a second terminal connected to a node N11, and the capacitor C1 is connected between the node N11 and a reference voltage, e.g., a ground voltage. The filter 110 may serve to average the output signal OUT to provide an analog signal AS, which is proportional to the duty cycle ratio of the output signal OUT.

The reference voltage generation unit 120 may be implemented with a voltage divider that includes resistors 121, 122 and 123 connected in series between a power supply voltage VDD and ground voltage. Using this divider network, the reference voltage generation unit 120 provides a first reference voltage REF1 (for example, 0.55 VDD) corresponding to an upper limit of a target duty cycle ratio at a node N21 and a second reference voltage REF2 (for example, 0.45 VDD) corresponding to a lower limit of the target duty cycle ratio at a node N22. These reference voltages are obtained by setting the resistance values of resistors 121, 122, and 123. In one embodiment, the resistors are variable resistors to allow for the reference voltages to be varied, for example, to meet the requirements of a particular application. In another embodiment, the resistors may have fixed resistance values.

The comparison unit 130 may include comparators 131 and 132 and AND gates 133 and 134. The comparator 131 compares the analog signal AS and the first reference voltage REF1 to output a first comparison signal CS1. The comparator 131 may output the first comparison signal CS1 at a high level when the analog signal AS is equal to or greater than the first reference voltage REF1, and at a low level when the analog signal AS is less than the first reference voltage REF1.

The comparator 132 compares the analog signal AS and the second reference voltage REF2 to output a second comparison signal CS2. The comparator 132 may output the second comparison signal CS2 at a high level when the analog signal AS is equal to or greater than the second reference voltage REF2 and at a low level when the analog signal AS is less than the second reference voltage REF2.

The AND gate 133 performs AND operation on a first inverted signal of the first comparison signal CS1 and the second comparison signal CS2 to provide a first sensing output signal SO1. The AND gate 134 performs AND operation on the first inverted signal and a second inverted signal of the second comparison signal CS2 to provide a second sensing output signal SO2.

When the analog signal AS is equal to or greater than the first reference voltage REF1, the first and second sensing output signals SO1 and SO2 may have logical values of 00. When the analog signal AS is less than the first reference voltage REF1 and is equal to or greater than the second reference voltage REF2, the first and second sensing output signals SO1 and SO2 may have logical values 10. When the analog signal AS is less than the second reference voltage REF2, the first and second sensing output signals SO1 and SO2 may have logical values 11.

Therefore, the first and second sensing output signals SO1 and SO2 may indicate into which range of the resistors 121, 122, and 123 the duty cycle ratio of the output signal OUT belongs to.

The logic unit 21 in the pad unit 20a receives the first and second sensing output signals SO1 and SO2 and then determines logic levels of the pass signal PASS and the up signal UP. The pass signal PASS and the up signal UP are then input into the ATE 50 through the monitoring pads 22 and 23.

When the analog signal AS is less than the first reference voltage REF1 and is equal to or greater than the second reference voltage REF2, the pass signal PASS may have a high level based on the first sensing output signal SO1 with a high level. When the analog signal AS is equal to or greater than the first reference voltage REF1, the pass signal PASS and the up signal UP may have low levels based on the first and second sensing output signals SO1 and SO2 with low levels. When the analog signal AS is less than the second reference voltage REF2, the pass signal PASS has a low level and the up signal UP has a high level.

The ATE 50 generates fuse control signals FCON for selectively programming the fuse elements in the fuse unit 300 based on logic levels of the pass signal PASS and the up signal UP. The fuse control signals FCON may include a program signal PGM, a selection signal SEL, a high voltage VP for programming, and a ground voltage GND for un-programming.

Figure 3:
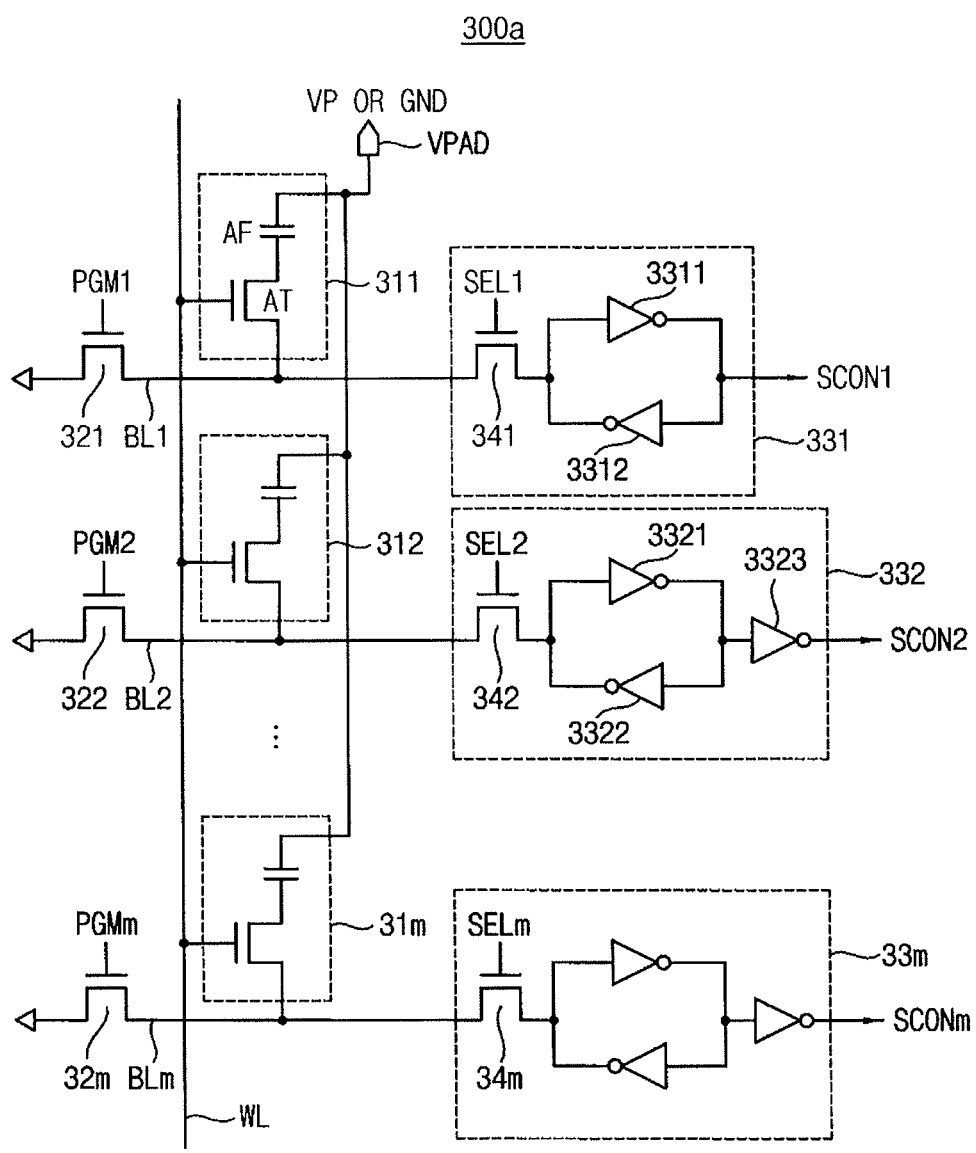
FIG. 3 illustrates an embodiment of a fuse unit in FIG. 1.

FIG. 3 illustrates an embodiment of the fuse unit in FIG. 1. Referring to FIG. 3, a fuse unit 300a may include a plurality of fuse cells 311~31m, a plurality of program transistors 321~32m, and a plurality of sensing units 331~33m. The fuse cells 311~31m are connected between bit lines BL1~BLm and a word line WL. The program transistors 321~32m are coupled to respective ones of the bit lines BL1~BLm and have gates that receive corresponding program signals PGM1~PGMm. The sensing units 331~33m are connected to respective ones of the fuse cells 311~31m through the bit lines BL1~BLm.

Each of the fuse cells 311~31m may include an anti-fuse AF and an access transistor AT. The anti-fuse AF has a first terminal connected to a voltage pad to which high voltage VP for programming or a ground voltage GND is applied and a second terminal connected to a first terminal of the access transistor AT. The access transistor AT has a second terminal connected to the bit line BL1 and has a gate connected to the word line WL.

The sensing units 331, 333, . . . are connected to odd bit lines BL1, BL3, . . . and may include a latch unit having a selection transistor 341 and cross-coupled inverters 3311 and 3312. The sensing units 332 334 . . . are connected to even bit lines BL2 BL4 . . . and may include a latch unit having a selection transistor 342, cross-coupled inverters 3321 and 3322, and an inverter 3323.

The ATE 50 applies a high voltage VP or ground voltage GND to the voltage pad VPAD according to logic levels of the pass signal PASS and the up signal UP, and may determine logic levels of the program signals PGM1~PGMn and the selection signals SEL1~SELm to be provided to the fuse unit 300a.

When two fuse cells 311 and 312 are required and the pass signal PASS has a high level, the ATE 50 applies the ground voltage GND to the voltage pad VPAD and provides the program signals PGM1 and PGM2 with high level and the selection signals SEL1 and SEL2 with high levels to the fuse unit 300a. As a result, the fuse cells 311 and 312 are not programmed and duty cycle control signals SCON1 and SCON2 are output to the driver unit 200. Because the fuse cells 311 and 312 are not programmed, the sensing unit 331 outputs the duty cycle control signal SCON1 at a high level and the sensing out 332 outputs the duty cycle control signal SCON2 at a low level.

When two fuse cells 311 and 312 are required and the pass signal PASS has a low level and the up signal UP has a high level, the ATE 50 applies the high voltage VP to the voltage pad VPAD and provides the program signals PGM1 with high level and PGM2 with low level and the selection signals SEL1 and SEL2 at a high level to the fuse unit 300a. As a result, the fuse cell 311 is programmed and the fuse cell 312 is not programmed and duty cycle control signals SCON1 and SCON2 are output to the driver unit 200. Because the fuse cell 311 is programmed and the fuse cell 312 is not programmed, the sensing unit 331 outputs the duty cycle control signal SCON1 at a low level and the sensing out 332 outputs the duty cycle control signal SCON2 at a low level.

When two fuse cells 311 and 312 are required and the pass signal PASS has a low level and the up signal UP has a low level, the ATE 50 applies the high voltage VP to the voltage pad VPAD and provides the program signals PGM1 with low level and PGM2 with high level and the selection signals SEL1 and SEL2 at a high level to the fuse unit 300a. As a result, the fuse cell 311 is not programmed and the fuse cell 312 is programmed and duty cycle control signals SCON1 and SCON2 are output to the driver unit 200. Because the fuse cell 311 is not programmed and the fuse cell 312 is programmed, the sensing unit 331 outputs the duty cycle control signal SCON1 at a high level and the sensing out 332 outputs the duty cycle control signal SCON2 at a high level.

Figure 4:
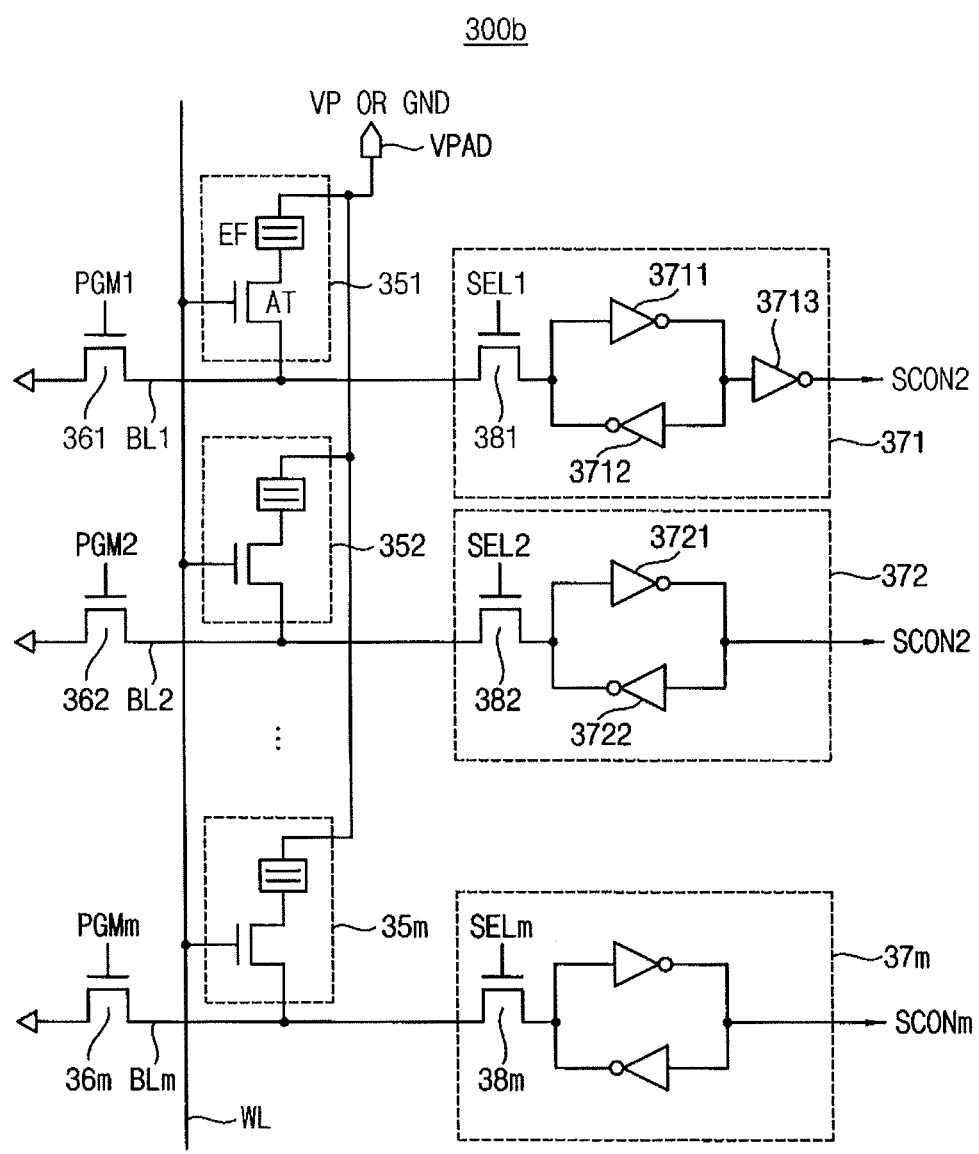
FIG. 4 illustrates another embodiment of the fuse unit in FIG. 1.

FIG. 4 illustrates another embodiment of the fuse unit in FIG. 1. Referring to FIG. 4, in this embodiment, a fuse unit 300b may include a plurality of fuse cells 351~35m, a plurality of program transistors 361~36m, and a plurality of sensing units 371~37m. The fuse cells 351~35m are connected between bit lines BL1~BLm and a word line WL. The program transistors 361~36m are connected to respective ones of the bit lines BL1~BLm and have gates to receive corresponding program signals PGM1~PGMm. The sensing unit 371~37m are connected to respective ones of the fuse cells 351~35m through the bit lines BL1~BLm.

Unlike the embodiment in FIG. 3, each of the fuse cells 351~35m may include an electrical fuse EF as well as an access transistor AT. The electrical fuse EF has a first terminal connected to a voltage pad to which high voltage VP for programming or a ground voltage GND is applied and a second terminal connected to a first terminal of the access transistor AT. The access transistor AT has a second terminal connected to a corresponding bit line BL and has a gate connected to the word line WL.

The sensing units 371, 373, . . . are connected to odd bit lines BL1, BL3, . . . and may include a latch unit having a selection transistor 381, cross-coupled inverters 3711 and 3712 and an inverter 3713. The sensing units 372, 374 . . . are connected to even bit lines BL2 BL4 . . . and may include a latch unit having a selection transistor 382 and cross-coupled inverters 3721 and 3722.

The ATE 50 applies the high voltage VP or the ground voltage GND to the voltage pad VPAD according to logic levels of the pass signal PASS and the up signal UP, and may determine logic levels of the program signals PGM1~PGMn and the selection signals SEL1~SELm to be provided to the fuse unit 300b.

When two fuse cells 351 and 352 are required and the pass signal PASS has a high level, the ATE 50 applies the ground voltage GND to the voltage pad VPAD and provides the program signals PGM1 and PGM2 at a high level and the selection signals SEL1 and SEL2 at a high level to the fuse unit 300b. As a result, the fuse cells 351 and 352 are not programmed and duty cycle control signals SCON1 and SCON2 are output to the driver unit 200. Because the fuse cells 351 and 352 are not programmed, the sensing unit 371 outputs the duty cycle control signal SCON1 at a high level and the sensing out 372 outputs the duty cycle control signal SCON2 at a level.

Figure 5:
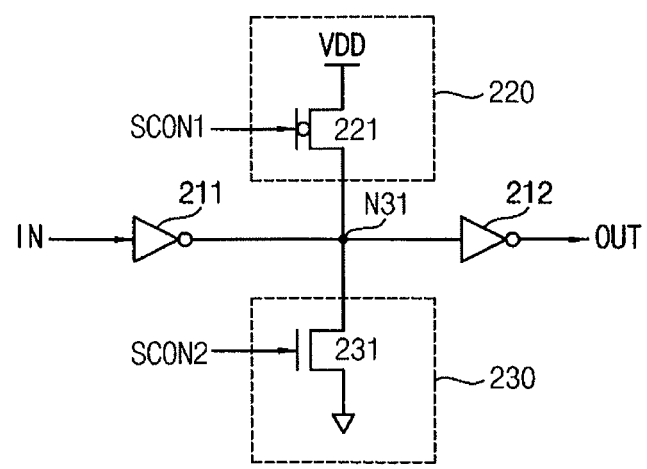
FIG. 5 illustrates an embodiment of a driver unit in FIG. 1.

FIG. 5 illustrates an embodiment of the driver unit in FIG. 1. Referring to FIG. 5, a driver unit 200a may include buffers 211 and 212, a pull-up control unit 220, and a pull-down control unit 230.

The buffers 211 and 212 may be implemented by or include inverters and may be connected to each other in series at a connection node N31. The buffer 211 buffers the input signal IN and the buffer 212 buffers an output of the buffer 211 to provide the output signal OUT. In this implementation, the pull-up control unit 220 includes a p-type metal-oxide semiconductor (PMOS) transistor 221, which is connected between the power supply voltage VDD and the connection node N31 and which has a gate receiving the first duty cycle control signal SCON1. The pull-up control unit 220 increases the pull-up strength of the output signal OUT in response to the first duty cycle control signal SCON1.

The pull-down control unit 230 includes a n-type metal-oxide semiconductor (NMOS) transistor 231, connected between the ground voltage and the connection node N31 and having a gate receiving the second duty cycle control signal SCON2. The pull-down control unit 230 increases the pull-down strength of the output signal OUT in response to the second duty cycle control signal SCON2. The duty cycle ratio of the output signal OUT may be adjusted based on operation of the pull-up and pull-down control units. For example, the duty cycle ratio of the output signal OUT may be increased when the pull-up strength of the output signal OUT is increased, and the duty cycle ratio of the output signal OUT may be decreased when the pull-up strength of the output signal OUT is increased.

Figure 6:
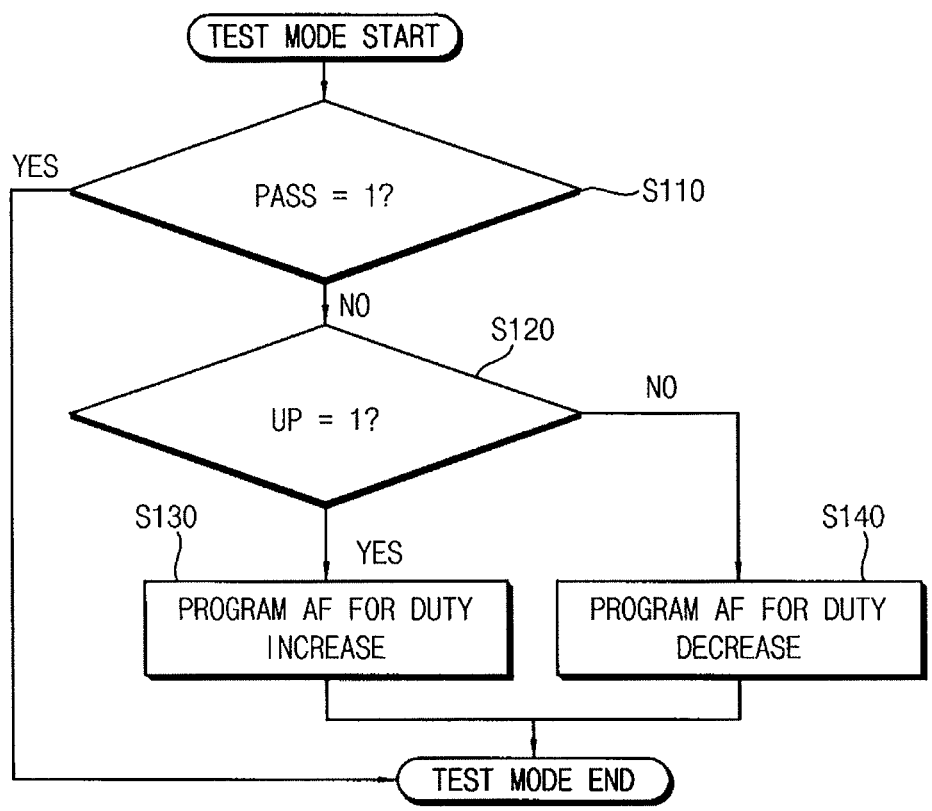
FIG. 6 illustrates an operation of the duty cycle correction circuit of FIG. 1.

FIG. 6 illustrates an example of the operation of the duty cycle correction unit of FIG. 1. In this example, it is assumed that the duty cycle corrector 10 of FIG. 1 includes the units of FIGS. 2 through 5.

Referring to FIGS. 1 through 6, when the test mode begins, the ATE provides the input signal IN, toggling periodically, to the driver unit 200a and the driver unit 200a outputs the output signal OUT, toggling periodically. The duty cycle sensing unit 100a senses the duty cycle ratio of the output signal OUT and provides the sensing output signals SO1 and SO2 to the pad unit 20a based on the sensed duty cycle ratio. The pad unit 20a provides the pass signal PASS and the up signal UP to the ATE 50 according to logic levels of the sensing output signals SO1 and SO2.

The ATE 50 determines whether the pass signal PASS has a high level (S110). When the pass signal PASS has a high level (YES in S110), the pass signal PASS indicates that the duty cycle ratio of the output signal OUT is within a range of the target duty cycle ratio. Therefore, the ATE 50 applies the ground voltage GND to the voltage pad VPAD and provides the program signals PGM1 and PGM2 to the fuse unit 300. As a result, the fuse cells 311 and 312 are not programmed.

Accordingly, because the duty cycle control signal SCON1 at a high level is applied to the PMOS transistor 221 and the duty cycle control signal SCON2 at a low level is applied to the NMOS transistor 231, the duty cycle ratio of the output signal OUT is maintained.

When the pass signal PASS does not have a high level (NO in S110), the ATE 50 determines whether the up signal UP has a high level (S120). When the up signal UP has a high level (YES in S120), the up signal UP indicates that the duty cycle ratio of the output signal OUT is lower than the second reference voltage REF2. Therefore, the ATE 50 applies the high voltage VP to the voltage pad VPAD and provides the program signal PGM1 at a high level and the program signal PGM2 at a low level to the fuse unit 300. As a result, the fuse cell 311 is programmed and the fuse cell 312 is not programmed.

Accordingly, because the duty cycle control signal SCON1 at a low level is applied to the PMOS transistor 221 and the duty cycle control signal SCON2 at a low level is applied to the NMOS transistor 231, the pull-up strength of the output signal OUT is increased and the duty cycle ratio of the output signal OUT is increased.

When the up signal UP does not have a high level (NO in S120), this indicates that the duty cycle ratio of the output signal OUT is higher than the first reference voltage REF1. Therefore, the ATE 50 applies the high voltage VP to the voltage pad VPAD and provides the program signal PGM1 at a low level and the program signal PGM2 at a high level to the fuse unit 300. As a result, the fuse cell 311 is not programmed and the fuse cell 312 is programmed.

Accordingly, because the duty cycle control signal SCON1 at a high level is applied to the PMOS transistor 221 and the duty cycle control signal SCON2 at a high level is applied to the NMOS transistor 231, the pull-down strength of the output signal OUT is increased and the duty cycle ratio of the output signal OUT is decreased.

Figure 7:
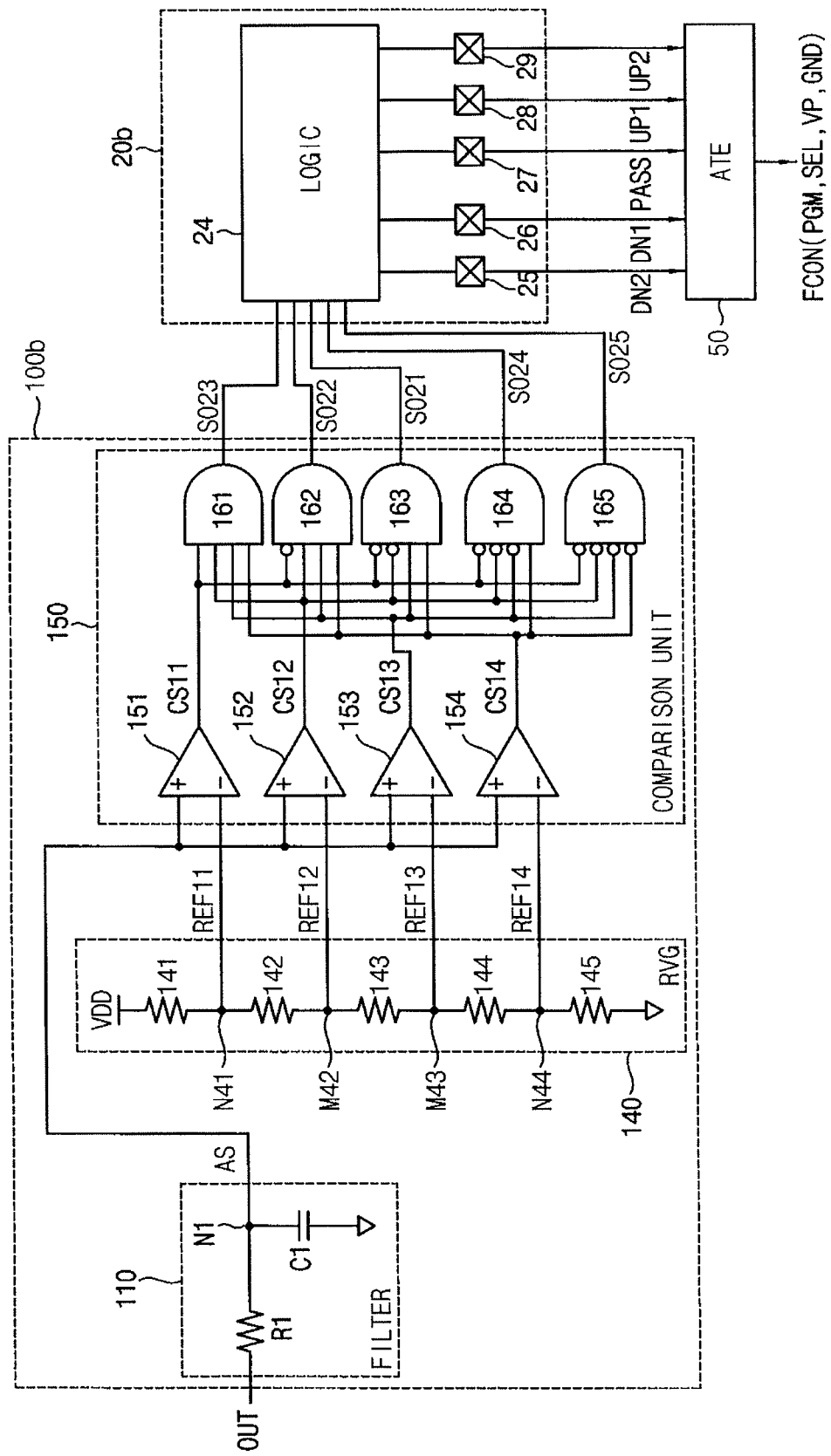
FIG. 7 illustrates another embodiment of the duty cycle sensing unit and pad unit.

FIG. 7 illustrates another embodiment of the duty cycle sensing unit and the pad unit in FIG. 1. Referring to FIG. 7, a duty cycle sensing unit 100*b* may include a filter 110, a reference voltage generation unit 140, and a comparison unit 150. The pad unit 20*b* may include a logic unit 24 and monitoring pads 25~29.

The filter 110 includes a first resistor R1 and a capacitor C1. The resistor R1 has a first terminal receiving the output signal OUT and a second terminal connected to a node N11. The capacitor C1 is connected between the node N1 and a ground voltage. The filter 110 averages the output signal OUT to provide an analog signal AS, which is proportional to the duty cycle ratio of the output signal OUT.

The reference voltage generation unit 140 may be implemented with or include a voltage divider that includes resistors 141~145 connected in series between a power supply voltage VDD and the ground voltage. The reference voltage generation unit 140 may therefore provide a first reference voltage REF11 (for example, 0.55 VDD) corresponding to an upper limit of a target duty cycle ratio at a node N41, a second reference voltage REF12 (for example, 0.525 VDD) at a node N42, a third reference voltage REF13 (for example, 0.475 VDD) at a node N43, and a fourth reference voltage REF14 (for example, 0.45 VDD) corresponding to a lower limit of the target duty cycle ratio at a node N42 by adjusting resistances of the resistors 141~445.

The comparison unit 150 may include comparators 151~154 and AND gates 161~165. The comparator 151 compares the analog signal AS and the first reference voltage REF11 to output a first comparison signal CS11, the comparator 152 compares the analog signal AS and the second reference voltage REF12 to output a second comparison signal CS12, the comparator 153 compares the analog signal AS and the third reference voltage REF13 to output a third comparison signal CS13, and the comparator 154 compares the analog signal AS and the fourth reference voltage REF14 to output a fourth comparison signal CS14.

Therefore, when the analog signal AS is equal to or greater than the first reference voltage REF11, the comparison signals CS11~CS14 may have logical values of 1111. When the analog signal AS is between the first reference voltage REF11 and the second reference voltage REF12, the comparison signals CS11~CS14 may have logical values of 0111. When the analog signal AS is between the second reference voltage REF12 and the third reference voltage REF13, the comparison signals CS11~CS14 may have logical values 0011. When the analog signal AS is between the third reference voltage REF13 and the fourth reference voltage REF14, the comparison signals CS11~CS14 may have logical values of 0001. When the analog signal AS is less than the fourth reference voltage REF14, the comparison signals CS11~CS14 may have logical values of 0000.

The AND gate 161 performs an AND operation on the comparison signals CS11~CS14 to output a sensing output signal SO23 The AND gate 162 performs an AND operation on the comparison signals CS12~CS14 and an inverted signal of the comparison signal CS11 to output a sensing output signal SO22. The AND gate 163 performs an AND operation on the comparison signals CS13 and CS14 and inverted signals of the comparison signals CS11 and CS12 to output a sensing output signal SO21. The AND gate 164 performs an AND operation on the comparison signal CS14 and inverted signals of the comparison signals CS11~CS13 to output a sensing output signal SO24. The AND gate 165 performs an AND operation on inverted signals of the comparison signals CS11~CS14 to output a sensing output signal SO25.

Therefore, the sensing output signal SO21 has a high level only when the analog signal AS is between the second reference voltage REF12 and the third reference voltage REF13. The sensing output signal SO21 has a low level in other cases.

The logic unit 24 in the pad unit 20*b* receives the sensing output signals SO21~SO25 and determines logic levels of the pass signal PASS, up signals UP1 and UP2, and down signals DN1 and DN2. The pass signal PASS, the up signals UP1 and UP2, and the down signals DN1 and DN2 are then input into the ATE 50 through corresponding ones of the monitoring pads 25~29.

The ATE 50 generates fuse control signals FCON for selectively programming the fuse elements in the fuse unit 300 based on logic levels of the pass signal PASS, up signals UP1 and UP2 and down signals DN1 and DN2. The fuse control signals FCON may include a program signal PGM, a selection signal SEL, a high voltage VP for programming and a ground voltage GND for un-programming.

Figure 8:
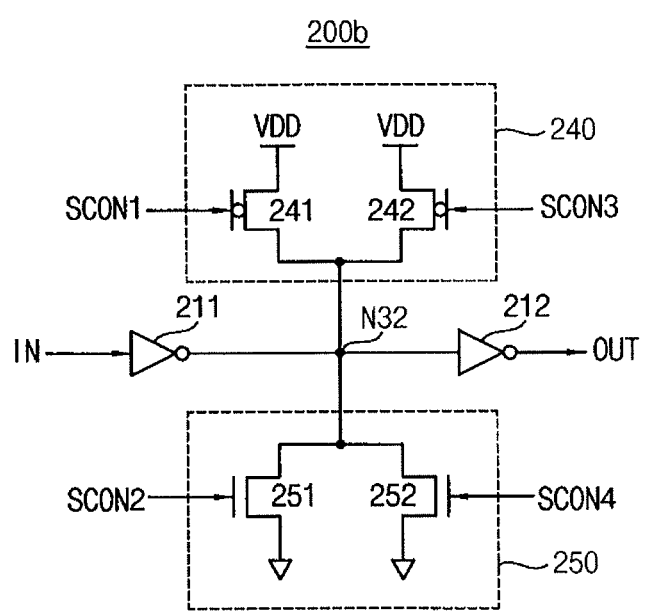
FIG. 8 illustrates another embodiment of the driver unit.

FIG. 8 illustrates another embodiment of the driver unit in FIG. 1. Referring to FIG. 8, a driver unit 200*b* may include buffers 211 and 212, a pull-up control unit 240 and a pull-down control unit 250.

The buffers 211 and 212 may be implemented by or include inverters and may be connected to each other in series at a connection node N32. The buffer 211 buffers the input signal IN and the buffer 212 buffers an output of the buffer 211 to provide the output signal OUT. The pull-up control unit 240 includes PMOS transistors 241 and 242, which are connected in parallel between the power supply voltage VDD and the connection node N33 and which have gates receiving duty cycle control signals SCON1 and SCON3, respectively. The PMOS transistors 241 and 242 individually increase the pull-up strength of the output signal OUT in response to the duty cycle control signals SCON1 and SCON3.

The pull-down control unit 250 includes NMOS transistors 251 and 252, connected between the ground voltage and the connection node N32 and having gates receiving duty cycle control signals SCON2 and SCON4, respectively. The NMOS transistors 251 and 252 individually increase the pull-down strength of the output signal OUT in response to the duty cycle control signals SCON2 and SCON4.

Operation of the duty cycle corrector 10 with reference to FIGS. 1, 7, and 8 will now be described. When the analog signal AS is between the second reference voltage REF2 and the third reference voltage REF3, the sensing output signals SO21~SO25 have logical values of 10000. Therefore, the pass signal PASS is at a high level, and the up signals UP1 and UP2 and the down signals DN1 and DN2 are all at a low level.

The ATE 50 applies the ground voltage GND to the voltage pad VPAD, and provides the program signals PGM and the selection signals SEL such that corresponding fuse elements are not programmed. The fuse unit 300 provides the duty cycle control signals SCON1 and SCON3 at a high level to the gates of the PMOS transistors 241 and 242 and the duty cycle control signals SCON2 and SCON4 at a low level to the gates of the NMOS transistors 251 and 252. Therefore, the duty cycle ratio of the output signal OUT is maintained.

When the analog signal AS is between the first reference voltage REF1 and the second reference voltage REF2, the sensing output signals SO21~SO25 have logical values of 01000. Therefore, the pass signal PASS, the up signals UP1 and UP2, and the down signals DN1 and DN2 have logical values of 01000.

The ATE 50 applies the high voltage VP to the voltage pad VPAD, and provides the program signals PGM and the selection signals SEL such that the fuse element in the fuse cell 311 is programmed and other fuse elements are not programmed. The fuse unit 300 provides the duty cycle control signals SCON1 and SCON3 at low and high levels to the gates of the PMOS transistors 241 and 242, and the duty cycle control signals SCON2 and SCON4 at a low level to the gates of the NMOS transistors 251 and 252. Therefore, the duty cycle ratio of the output signal OUT is increased by amount of the pull-up strength of the PMOS transistor 241.

When the duty cycle sensing unit 100b of FIG. 7 and the driver unit 200b of FIG. 8 are employed in the duty cycle corrector 10, the duty cycle ratio of the output signal OUT may be more finely adjusted. As the number of comparators and AND gates in the duty cycle sensing unit 100 increases, the duty cycle ratio of the output signal OUT may be even more finely adjusted.

Figure 9:
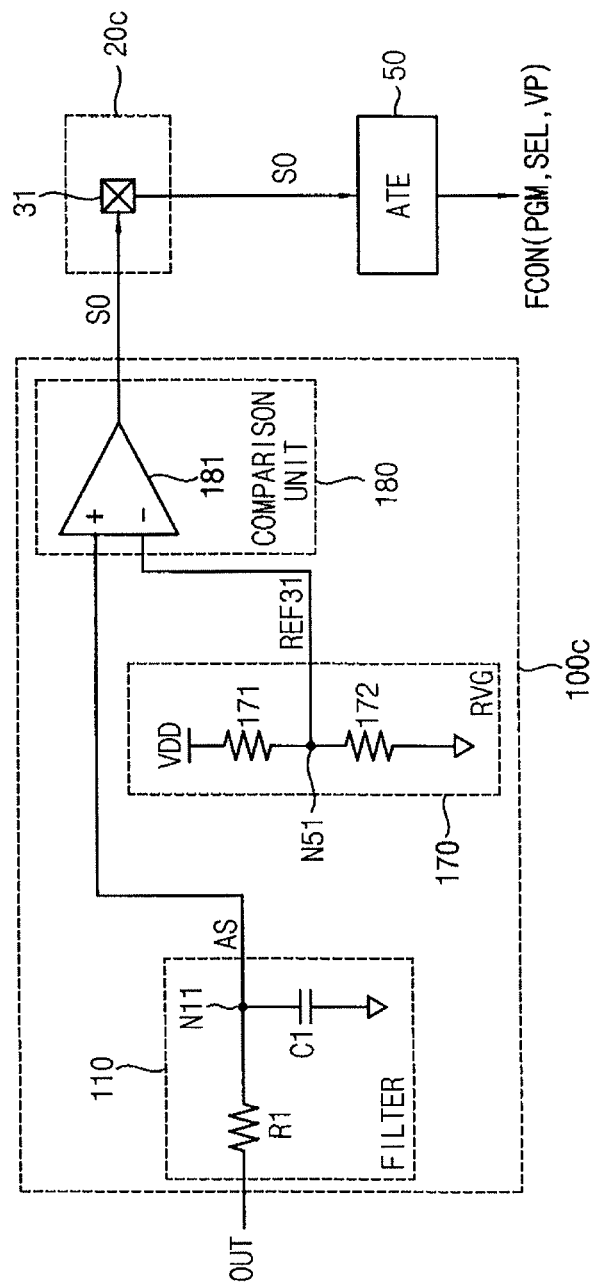
FIG. 9 illustrates another embodiment of the duty cycle sensing unit and pad unit.

FIG. 9 illustrates another embodiment of the duty cycle sensing unit and the pad unit in FIG. 1. Referring to FIG. 9, a duty cycle sensing unit 100c may include a filter 110, a reference voltage generation unit 170, and a comparison unit 180, and a pad unit 20c may include a monitoring pad 31.

The filter 110 includes a first resistor R1 and a capacitor C1. The first resistor R1 has a first terminal receiving the output signal OUT and a second terminal connected to a node N11. The capacitor C1 is connected between the node N11 and a ground voltage. Therefore, the filter 110 averages the output signal OUT to provide an analog signal AS, which is proportional to the duty cycle ratio of the output signal OUT.

The reference voltage generation unit 170 may be implemented with a voltage divider that includes resistors 171 and 172 connected in series between a power supply voltage VDD and the ground voltage. Therefore, the reference voltage generation unit 170 may provide a reference voltage REF31 (for example, 0.5 VDD) corresponding to a target duty cycle ratio at a node N51 by adjusting resistances of the resistors 171 and 172.

The comparison unit 180 includes a comparator 181 that compares the analog signal AS and the reference voltage REF31 to output a sensing output signal SO. The pad unit 20c includes a monitoring pad 31 that provides the sensing output signal SO to the ATE 50. The ATE 50 generates a fuse control signal FCON to the fuse unit 30 according to a logic level of the sensing output signal SO.

Figure 10:
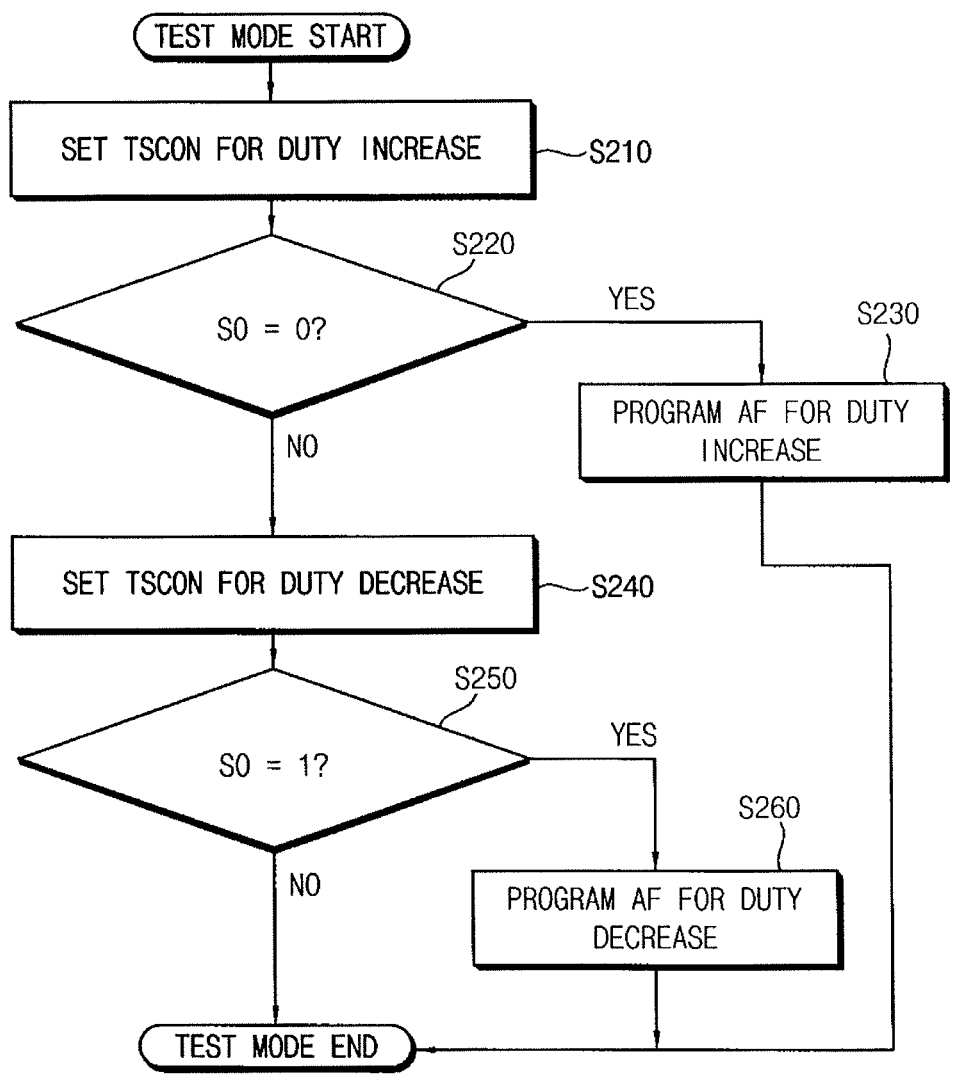
FIG. 10 illustrates an operation of the duty cycle correction circuit of FIG. 1.

FIG. 10 illustrates another example of the operation of the duty cycle correction unit of FIG. 1. In FIG. 10, it is assumed that the duty cycle corrector 10 of FIG. 1 includes the units of FIGS. 3, 5 and 9.

Referring to FIGS. 3, 5, 9 and 10, when the test mode begins, the duty cycle ratio of the output signal OUT is increased using TMRS 400 that sets a duty cycle control signal TSCON to a low level, which is then applied to the PMOS transistor 221 in the pull-up control unit 220 (S210). The ATE 50 determines whether the sensing output signal SO is at a low level through the monitoring pad 31 (S220). When the sensing output signal SO is at a low level (YES in S220), the duty cycle ratio of the output signal OUT is lower than 50%.

As a result, the fuse unit 300 is programmed such that the duty cycle ratio of the output signal OUT is increased. Also, the fuse unit 300 applies the duty cycle control signal SCON1 at a low level to the gate of the PMOS transistor 221 and the duty cycle control signal SCON2 at a low level to the gate of the NMOS transistor 231 for increasing the pull-up strength of the output signal OUT (S230).

When the sensing output signal SO is not at a low level (NO in S220), the duty cycle ratio of the output signal OUT is higher than 50%. As a result, the fuse unit 300 is programmed such that the duty cycle ratio of the output signal OUT is decreased. Also, the fuse unit 300 applies the duty cycle control signal SCON1 at a high level to the gate of the PMOS transistor 221 and the duty cycle control signal SCON2 at a high level to the gate of the NMOS transistor 231 for increasing the pull-down strength of the output signal OUT (S240).

The ATE 50 determines whether the sensing output signal SO is at a high level through the monitoring pad 31 (S250). When the sensing output signal SO is high level (YES in S250), the duty cycle ratio of the output signal OUT is higher than 50%. As a result, the fuse unit 300 is programmed such that the duty cycle ratio of the output signal OUT is decreased. Also, the fuse unit 300 applies the duty cycle control signal SCON1 at a high level to the gate of the PMOS transistor 221 and the duty cycle control signal SCON2 at a high level to the gate of the NMOS transistor 231 for increasing the pull-down strength of the output signal OUT (S260).

When the sensing output signal SO is not at a high level (NO in S250), the test mode ends because the duty cycle ratio of the output signal OUT is decreased by the duty cycle control signal TSCON.

Figure 11A:
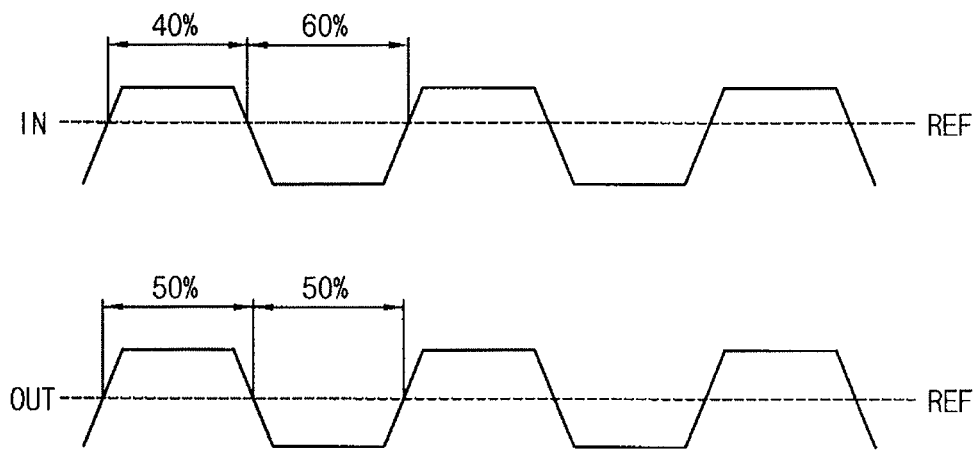
FIGS. 11A and 11B illustrate performance of aforementioned embodiments.
Figure 11B:
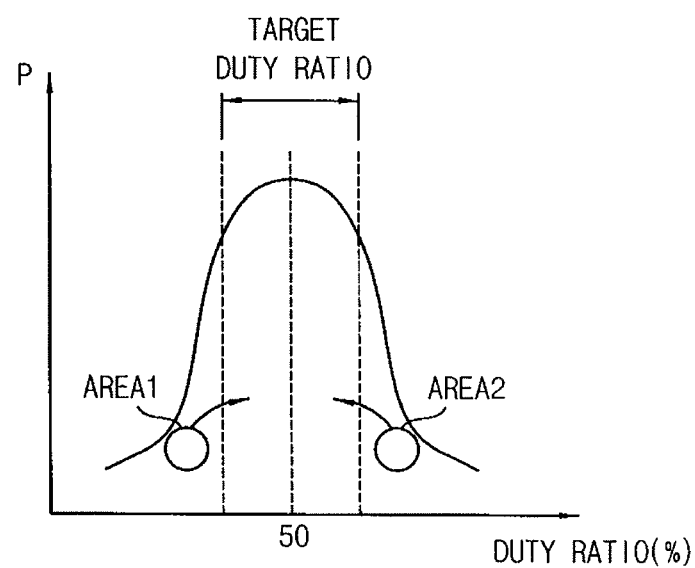

FIGS. 11A and 11B illustrate examples of a performance of one or more of the aforementioned embodiments. Referring to FIG. 11A, an input signal having a 40% duty cycle ratio with respect to a reference voltage REF is provided, and the output signal has about 50% duty cycle ratio with respect to the reference voltage REF after the duty cycle ratio is corrected by the duty cycle corrector 10. Referring to FIG. 11B, duty cycle distributions of areas AREA1 and AREA2 outside of the target duty cycle ratio move within the target duty cycle ratio.

Figure 12:
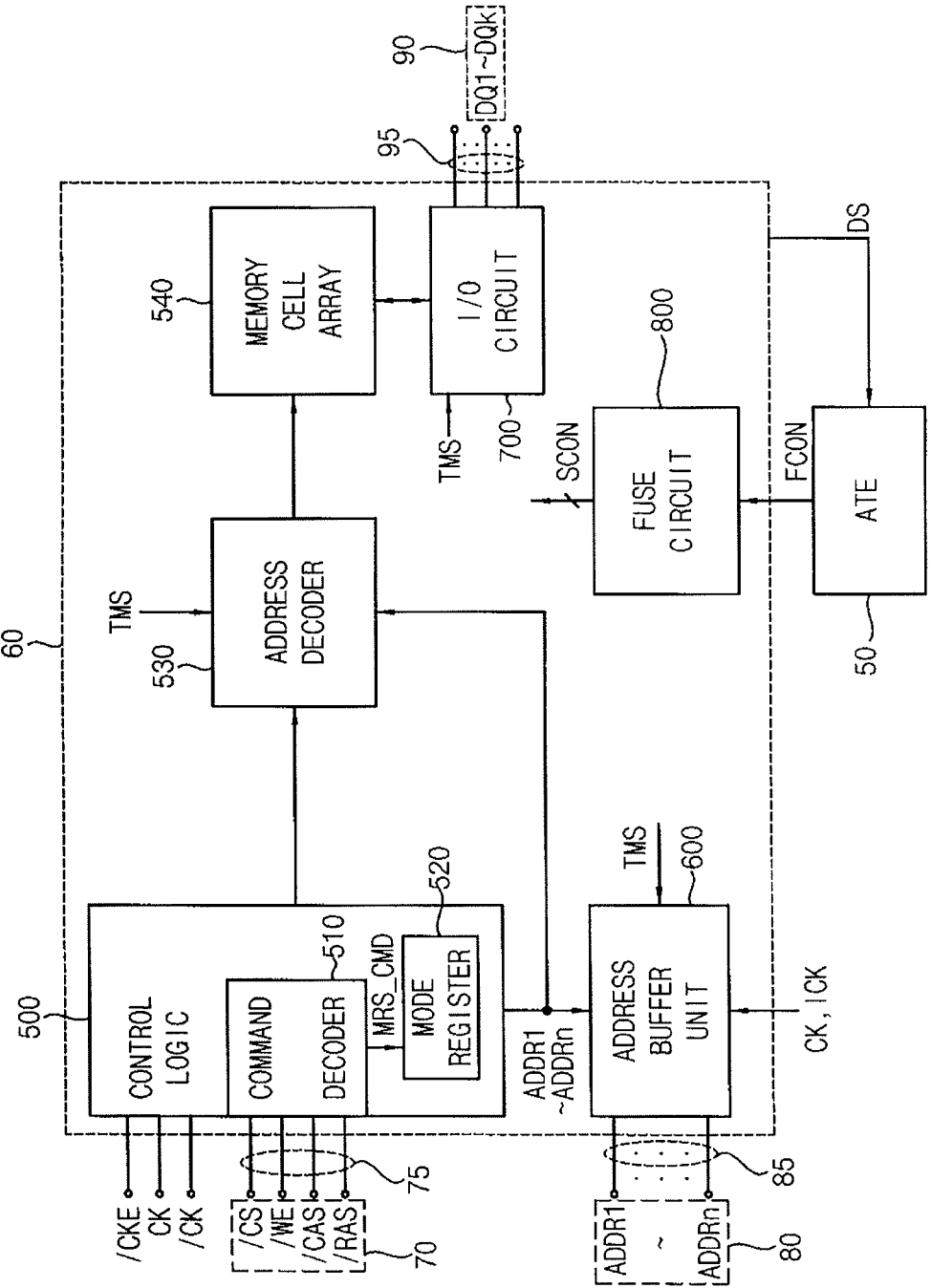
FIG. 12 illustrates an embodiment of a semiconductor memory device.

FIG. 12 illustrates an embodiment of a semiconductor memory device including any of the aforementioned embodiments of the duty cycle correction unit. Referring to FIG. 12, a semiconductor memory device 60 includes control logic 500, an address buffer unit 600, an address decoder 530, a memory cell array 540, an input/output (I/O) unit 700 and a fuse unit 800.

The control logic 500 receives control signals 70 through command pins 75, receives an address signal 80 through address pins 85, and controls the address decoder 530 which accesses the memory cell array 540 based on commands and the address signal. The control signals 70 include /CE, /WE, /CAS, and /RAS. The address signal 30 includes ADDR1~ADDRn. The combination of the control signals /CE, /WE, /CAS, and /RAS designate the command. In addition, in some embodiments, the control logic 500 may also receive a clock enable signal /CKE, a clock signal CK, and an inverted clock signal /CK.

The address buffer unit 600 receives the address signal 80 through the address pins 85, and provides the address signal ADDR1~ADDRn to the control logic 500 and the address decoder 530 in synchronization with the clock signal CK or the inverted clock signal /CK.

The I/O unit 700 provides data 90 to the memory cell array 540 or receives the data 90 from the memory cell array 540 through the data pins 95. The data 90 includes DQ1~DQk.

The control logic 500 includes a command decoder 510 and a mode register 520. The command decoder 510 decodes the command designated by the control signals /CE, /WE, /CAS, and /RAS to provide a mode register set (MRS) command MRS_CMD to the mode register 520. The mode register 520 sets an operation mode of the semiconductor memory device 60 in response to the MRS command MRS_CMD. The operation mode of the semiconductor memory device 60 may include a test mode, MRS mode, TMRS mode and a normal operation mode. The fuse unit 800 may be implemented, for example, with the fuse unit 300*a* of FIG. 3 or the fuse unit 300*b* of FIG. 4.

In one embodiment, the duty cycle sensing unit 100 and the driver unit 200 of the duty cycle corrector 10 may be disposed in at least one of a data path including the memory cell array 540, the I/O unit 700 and the data pin 95, an address path including the address pin 85, the address buffer unit 600 and the address decoder 530 and a clock path in which the clock signals CK and /CK are delivered. Therefore, the duty cycle sensing unit 100 and the driver unit 200 receive the input signal, toggling periodically, sense the duty cycle ratio of the input signal, selectively program the fuse elements in the fuse unit 800 based on the sensed duty cycle ratio, and correct duty cycle ratio of the signal toggling periodically in the test mode when a test mode signal TMS is enabled. As a result, the semiconductor memory device may achieve enhanced performance by correcting duty cycle ratio in the data path and the address path in which signals are not toggling periodically are delivered.

Figure 13:
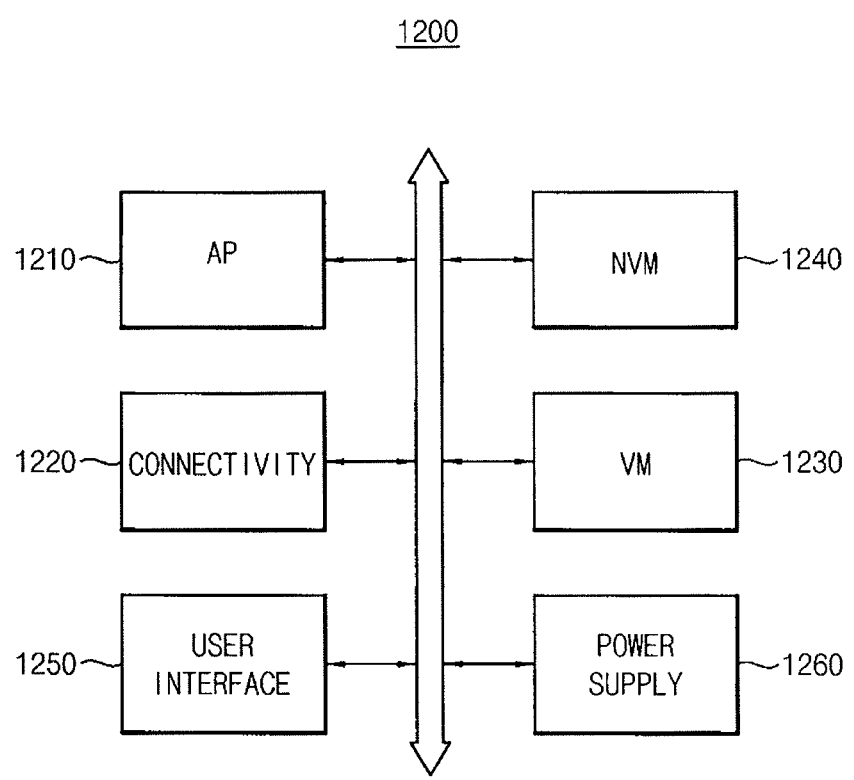
FIG. 13 illustrates an embodiment of a mobile system.

FIG. 13 illustrates an embodiment of a mobile system 1200 which includes an application processor 1210, a connectivity unit 1220, a volatile memory device (VM) 1230, a nonvolatile memory device 1240, a user interface 1250, and a power supply 1260. In some embodiments, the mobile system 1200 may be a mobile phone, a smart phone, a personal digital assistant (PDA), a portable multimedia player (PMP), a digital camera, a music player, a portable game console, a navigation system, or another type of electronic device.

The application processor 1210 may execute applications such as a web browser, a game application, a video player, etc. In some embodiments, the application processor 1210 may include a single core or multiple cores. For example, the application processor 1210 may be a multi-core processor such as a dual-core processor, a quad-core processor, a hexa-core processor, etc. The application processor 1210 may include an internal or external cache memory.

The connectivity unit 1220 may perform wired or wireless communication with an external device. For example, the connectivity unit 1220 may perform Ethernet communication, near field communication (NFC), radio frequency identification (RFID) communication, mobile telecommunication, memory card communication, universal serial bus (USB) communication, etc. In some embodiments, connectivity unit 1220 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 1230 may store data processed by the application processor 1210, or may operate as a working memory. For example, the volatile memory device 1230 may be a dynamic random access memory, such as DDR SDRAM, LPDDR SDRAM, GDDR SDRAM, RDRAM, etc. The volatile memory device 1230 receive the input signal toggling periodically, sense the duty cycle ratio of the input signal, selectively program the fuse elements in the fuse unit based on the sensed duty cycle ratio and correct duty cycle ratio of the signal toggling periodically as described with reference to FIGS. 1 through 12.

The nonvolatile memory device 1240 may store a boot image for booting the mobile system 1200. For example, the nonvolatile memory device 1240 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 1250 may include at least one input device, such as a keypad, a touch screen, etc., and at least one output device, such as a speaker, a display device, etc. The power supply 1260 may supply a power supply voltage to the mobile system 1200. In some embodiments, the mobile system 1200 may further include a camera image processor (CIS), and/or a storage device, such as a memory card, a solid state drive (SSD), a hard disk drive (HDD), a CD-ROM, etc.

In some embodiments, the mobile system 1200 and/or components of the mobile system 1200 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), wafer-level processed stack package (WSP), etc.

Figure 14:
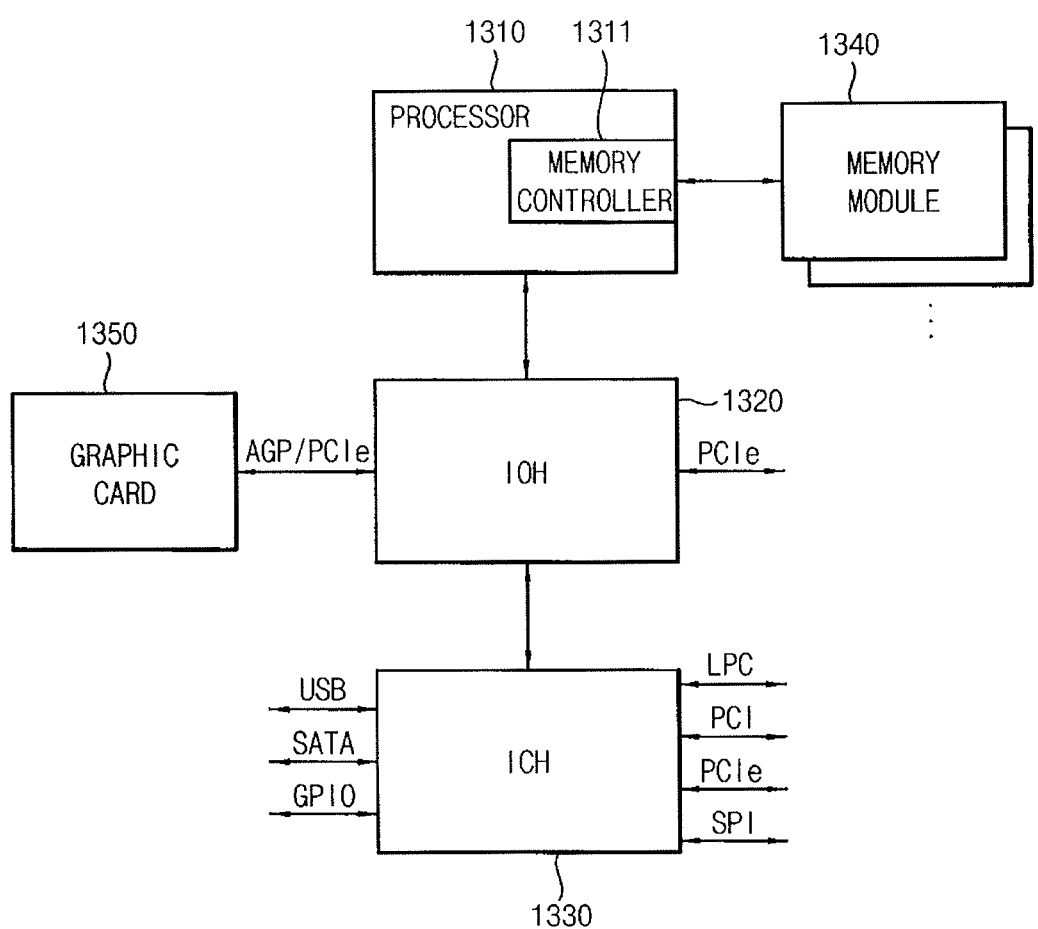
FIG. 14 illustrates an embodiment of a computing system.

FIG. 14 illustrates an embodiment of a computing system 1300, which includes a processor 1310, an input/output hub (IOH) 1320, an input/output controller hub (ICH) 1330, at least one memory module 1340, and a graphics card 1350. In some embodiments, the computing system 1300 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1310 may perform various computing functions such as executing specific software for performing specific calculations or tasks. For example, the processor 1310 may be a microprocessor, a central process unit (CPU), a digital signal processor, or the like. In some embodiments, the processor 1310 may include a single core or multiple cores. For example, the processor 1310 may be a multi-core processor, such as a dual-core processor, a quad-core processor, a hexa-core processor, etc. Although FIG. 40 illustrates the computing system 1300 including one processor 1310, in some embodiments, the computing system 1300 may include a plurality of processors. The processor 1310 may include an internal or external cache memory.

The processor 1310 may include a memory controller 1311 for controlling operations of the memory module 1340. The memory controller 1311 included in the processor 1310 may be referred to as an integrated memory controller (IMC). A memory interface between the memory controller 1311 and the memory module 1340 may be implemented with a single channel including a plurality of signal lines, or may bay be implemented with multiple channels, to each of which at least one memory module 1340 may be coupled. In some embodiments, the memory controller 1311 may be located inside the input/output hub 1320, which may be referred to as memory controller hub (MCH).

The memory module 1340 may include a plurality of volatile memory devices that store data provided from the memory controller 1311. The volatile memory devices receive the input signal toggling periodically, sense the duty cycle ratio of the input signal, selectively program the fuse elements in the fuse unit based on the sensed duty cycle ratio and correct duty cycle ratio of the signal toggling periodically as described with reference to FIGS. 1 through 12.

The input/output hub 1320 may manage data transfer between processor 1310 and devices, such as the graphics card 1350. The input/output hub 1320 may be coupled to the processor 1310 via various interfaces. For example, the interface between the processor 1310 and the input/output hub 1320 may be a front side bus (FSB), a system bus, a Hyper-Transport, a lightning data transport (LDT), a QuickPath interconnect (QPI), a common system interface (CSI), etc.

Although FIG. 14 illustrates the computing system 1300 including one input/output hub 1320, in some embodiments, the computing system 1300 may include a plurality of input/output hubs. The input/output hub 1320 may provide various interfaces with the devices. For example, the input/output hub 1320 may provide an accelerated graphics port (AGP) interface, a peripheral component interface-express (PCIe), a communications streaming architecture (CSA) interface, etc.

The graphic card 1350 may be coupled to the input/output hub 1320 via AGP or PCIe. The graphics card 1350 may control a display device (not shown) for displaying an image. The graphics card 1350 may include an internal processor for processing image data and an internal memory device. In some embodiments, the input/output hub 1320 may include an internal graphics device along with or instead of the graphics card 1350 outside the graphics card 1350. The graphics device included in the input/output hub 1320 may be referred to as integrated graphics. Further, the input/output hub 1320 including the internal memory controller and the internal graphics device may be referred to as a graphics and memory controller hub (GMCH).

The input/output controller hub 1330 may perform data buffering and interface arbitration to efficiently operate various system interfaces. The input/output controller hub 1330 may be coupled to the input/output hub 1320 via an internal bus, such as a direct media interface (DMI), a hub interface, an enterprise Southbridge interface (ESI), PCIe, etc. The input/output controller hub 1330 may provide various interfaces with peripheral devices. For example, the input/output controller hub 1330 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1310, the input/output hub 1320 and the input/output controller hub 1330 may be implemented as separate chipsets or separate integrated units. In other embodiments, at least two of the processor 1310, the input/output hub 1320 and the input/output controller hub 1330 may be implemented as a single chipset. Also, while many features of the embodiments are disclosed as units, in other embodiments those features may be implemented as other forms of logic including but not limited to code-based operations performed by a processor.

As mentioned above, the duty cycle correction unit and the system including the same may receive the input signal toggling periodically, sense the duty cycle ratio of the input signal, selectively program the fuse elements in the fuse unit based on the sensed duty cycle ratio and correct duty cycle ratio of the signal toggling periodically in a test mode and thus enhance performance. Exemplary embodiments described herein may be widely applicable for a variety of semiconductor memory devices and memory systems.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A duty cycle corrector, comprising:
    a sensing unit configured to sense a duty cycle ratio of an output signal toggling periodically to generate at least one sensing signal based on the sensed duty cycle ratio;
    a pad unit configured to output at least one decision signal based on the at least one sensing signal;
    a fuse unit that includes a plurality of fuse elements which are selectively programmed in response to a fuse control signal, the fuse unit configured to generate the duty control signal based on the fuse control signal to generate the duty cycle control signal; and
    a driver unit that buffers an input signal toggling periodically in a test mode and adjusts a duty cycle ratio of the input signal, the driver unit configured to adjust a pull-up strength or a pull-down strength of the input signal to generate the output signal in response to the duty control signal.

2. The duty cycle corrector of claim 1, wherein the sensing unit comprises:
a filter configured to average the output signal to provide an analog signal that is proportional to the duty cycle ratio of the output signal;
a reference voltage generation unit configured to generate at least one reference voltage according to a target duty cycle ratio; and
a comparison unit configured to compare the analog signal and the at least one reference voltage to provide the sensing signal.

3. The duty cycle corrector of claim 2, wherein the filter comprises:
a first resistor that has a first terminal to which the output signal is applied; and
a capacitor connected between a second terminal of the first resistor and a ground voltage.

4. The duty cycle corrector of claim 3, wherein:
the reference voltage generation unit comprises a plurality of resistors connected in series between a power supply voltage and the ground voltage, and
the reference voltage generation unit provides the at least one reference voltage to the comparison unit based on voltage division using the plurality of resistors.

5. The duty cycle corrector of claim 2, wherein the comparison unit comprises:
a first comparator configured to compare the analog signal and a first reference voltage of the at least one reference voltage;
a second comparator configured to compare the analog signal and a second reference voltage of the at least one reference voltage;
a first AND gate that performs AND operation on a first inverted output and an output of the second comparator to provide a first sensing signal, the first inverted output corresponding to an inverted output of the first comparator; and
a second AND gate that performs AND operation on a second inverted output and the first inverted output to provide a second sensing signal, the second inverted output corresponding to an inverted output of the second comparator.

6. The duty cycle corrector of claim 2, wherein the comparison unit comprises:
a first comparator configured to compare the analog signal and a first reference voltage of the at least one reference voltage;
a second comparator configured to compare the analog signal and a second reference voltage of the at least one reference voltage;
a third comparator configured to compare the analog signal and a third reference voltage of the at least one reference voltage;
a fourth comparator configured to compare the analog signal and a fourth reference voltage of the at least one reference voltage;
a first AND gate that performs AND operation on outputs of the first through fourth AND gates to provide a first sensing output signal;
a second AND gate that performs AND operation on outputs of the second through fourth AND gates and a first inverted output signal to provide a second sensing signal, the first inverted output corresponding to an inverted output of the first comparator;
a third AND gate that performs AND operation on outputs of the third and fourth AND gates, the first inverted output signal and a second inverted output signal to provide a third sensing signal, the second inverted output corresponding to an inverted output of the second comparator;
a fourth AND gate that performs AND operation on output of the fourth AND gates, the first and second inverted output signals and a third inverted output signal to provide a fourth output signal, the third inverted output corresponding to an inverted output of the third comparator; and
a fifth AND gate that performs AND operation on the first through third inverted output signals and a fourth inverted output signal to provide a fifth sensing signal, the fourth inverted output corresponding to an inverted output of the fourth comparator.

7. The duty cycle corrector of claim 1, wherein the pad unit comprises:
a logic unit configured to determine a logic level of the at least one decision signal based on the at least one sensing signal; and
at least one monitoring pad that outputs the at least one decision signal,
wherein the at least one decision signal includes a pass signal and at least one up signal, the pass signal indicating whether the duty cycle ratio of the output signal is within a range of the target duty cycle ratio, the up signal adjusting the pull-up strength and pull-down strength of the input signal to generate the output signal.

8. The duty cycle corrector of claim 1, wherein the fuse unit comprises:
a plurality of fuse cells that are selectively programmed in response to the fuse control signals;
a plurality of program transistors that select at least one of the fuse cells to be programmed in response to a program signal; and
a plurality of sensing units, each connected to each of the fuse cells, the sensing units providing the duty cycle control signals, wherein each of the fuse cells includes:
a fuse element connected to a voltage pad; and
an access transistor connected to the fuse element,
wherein the access transistor has a first terminal connected to the voltage pad and a second terminal connected to the access transistor, and one of the program voltage and a ground voltage is applied to the voltage bad according to whether the fuse element is programmed or not.

9. The duty cycle corrector of claim 8, wherein each of the fuse elements includes anti-fuse or electrical fuse.

10. The duty cycle corrector of claim 1, wherein the driver unit comprises:
a first buffer that buffers the input signal;
a second buffer connected in series with the first buffer at a connection node, the second buffer buffering an output of the first buffer to provide the output signal;
a pull-up control unit that increases the pull-up strength of the input signal in response to a first duty cycle control signal; and
a pull-down control unit that increases the pull-down strength of the input signal in response to a second duty cycle control signal.

11. The duty cycle corrector of claim 10, wherein:
the first duty cycle control signal has a logic low level when a first fuse element of the fuse elements is programmed, and
the second duty cycle control signal has a logic high level when a second fuse element of the fuse elements is programmed.

12. A system comprising:
   a semiconductor memory device including a sensing unit, a driver unit, and a fuse unit; and
   an automatic test equipment (ATE) configured to generate a plurality of fuse control signals for the fuse unit based on at least one sensing signal from the sensing unit, a plurality of fuse elements in the fuse unit being selectively programmed in response to the fuse control signals,
   the sensing unit configured to sense a duty cycle ratio of an output signal toggling periodically to generate the at least one sensing signal according to the sensed duty cycle ratio,
   the fuse unit configured to generate a plurality of duty cycle control signals based on the fuse control signals, and
   the driver unit configured to buffer an input signal toggling periodically in a test mode and to adjust a duty cycle of the input signal to provide the output signal, the driver unit adjusting a pull-up strength or a pull-down strength of the input signal in response to one of the duty control signals to set the duty ratio of the output signal.

13. The system of claim 12, wherein the sensing unit and the driver unit are included in at least one of a data path, a clock path, and an address path of the semiconductor memory device.

14. The system of claim 12, wherein:
   the semiconductor memory device further comprises a pad unit that provides the sensing signal to the ATE as at least one decision signal, and
   the at least one decision signal includes a pass signal and at least one up signal, the pass signal indicating whether the duty cycle ratio of the output signal is within a range of a target duty cycle ratio, the up signal adjusting the pull-up strength or the pull-down strength of the output signal.

15. The system of claim 14, wherein:
   the ATE generates the fuse control signals such that fuse elements in the fuse unit are not programmed when the pass signal indicates that the duty cycle ratio of the output signal is within a range of the target duty ratio, and
   the ATE generates the fuse control signals such that the pull-up strength or the pull-down strength of the input signal is increased when the pass signal indicates that the duty cycle ratio of the output signal is out of the range of the target duty ratio.

16. The duty cycle corrector of claim 1, wherein the fuse control signal is received in response to the at least one decision signal.

17. The duty cycle corrector of claim 1, wherein the fuse unit is configured to generate different duty cycle control signals based on different received fuse control signals.

18. A duty cycle corrector, comprising:
   a sensor to sense a duty cycle ratio of an output signal and generate at least one sensing signal based on the sensed duty cycle ratio;
   a pad to output at least one decision signal based on the at least one sensing signal;
   a fuse unit to generate a duty cycle control signal based on at least one received fuse control signal, the fuse unit including a plurality of selectively programmable fuse elements to be configured based on the fuse control signal in order to generate the duty cycle control signal; and
   a driver to adjust a duty cycle ratio of an input signal to generate the output signal, wherein the driver adjusts the duty cycle ratio of the input signal based on the duty cycle control signal, the driver adjusting the duty cycle ratio of the input signal by adjusting a pull-up strength or a pull-down strength of the input signal based on the duty cycle control signal.

19. The duty cycle corrector of claim 18, wherein the fuse control signal is received in response to the at least one decision signal.

20. The duty cycle corrector of claim 18, wherein the fuse unit is to generate different duty cycle control signals based on different received fuse control signals.

\* \* \* \* \*